United States Patent [19]

Nagakubo et al.

[11] Patent Number: 5,515,682

[45] Date of Patent: May 14, 1996

[54] PELTIER CONTROL CIRCUIT AND A PELTIER DEVICE STRUCTURE

[75] Inventors: Yasunori Nagakubo; Takashi Tsuda; Tetsuo Ishizaka; Shunichi Sato; Saeko Yokoi; Manabu Komiyama; Toshio Ohya; Noriaki Mizuguchi, all of Kawasaki, Japan

[73] Assignee: Fujitsu Limited, Kawasaki, Japan

[21] Appl. No.: 342,032

[22] Filed: Nov. 17, 1994

[30] Foreign Application Priority Data

Apr. 19, 1994 [JP] Japan .................. 6-080449

[51] Int. Cl.$^6$ .................................................. F25B 21/02
[52] U.S. Cl. ............................ 62/3.7; 62/3.3; 62/208; 165/26
[58] Field of Search ............................. 62/3.1, 3.3, 3.7, 62/208, 209, 214, 230; 165/26; 236/1 C

[56] References Cited

U.S. PATENT DOCUMENTS

| | | | |
|---|---|---|---|
| 3,241,603 | 3/1966 | Nagata | 62/3.3 X |
| 3,304,726 | 2/1967 | Beck | 62/3.3 |
| 4,301,658 | 11/1981 | Reed | 165/26 X |
| 4,838,032 | 6/1989 | Maslaney et al. | 62/3.7 |
| 5,320,162 | 6/1994 | Seaman | 62/3.7 X |

Primary Examiner—Harry B. Tanner
Attorney, Agent, or Firm—Armstrong, Westerman, Hattori, McLeland & Naughton

[57] ABSTRACT

A Peltier control circuit detects a temperature of a device combined with a Peltier device and controls a current flowing through the Peltier device so as to keep the temperature of the device at a predetermined value. The circuit has a temperature sensing section for detecting the temperature of a device, a comparing section for comparing a temperature detection value with a predetermined temperature reference value, a limiting section for providing a comparison output with the limitation of a current flowing through the Peltier device and providing the limitation with a predetermined temperature characteristics, and a driving section for providing the Peltier device with an input or output driving current in accordance with the comparison output via the limiting section.

16 Claims, 17 Drawing Sheets

WB(L1)

WB(L2)

2 LD   3   4

1

$$f = \frac{1}{2\pi(L2C_{TEL})^{1/2}}$$

AT THE OBSERVATION VALUES
L2=1.4mH
$C_{TEL}$=3pF
∴ f=2.46GHz

PELTIER CONTROL CIRCUIT AND A PELTIER DEVICE STRUCTURE

BACKGROUND OF THE INVENTION

1. Field of the Invention

The present invention relates to a Peltier device and a control circuit thereof, and more particularly to the structure of a Peltier device for fixing an operating temperature of a semiconductor laser and a temperature control of the Peltier device.

2. Description of the Related Art

Presently, in order to fix a temperature of a laser diode (LD) device, a Peltier device is used in a laser diode module for high speed optical communication, e.g., 2.4 G bit/sec, etc.

For example, a laser diode that emits a light beam is mounted on the top of a Peltier device, and the Peltier device performs a heating or cooling operation so as to fix the operating temperature of the laser diode.

A Peltier device has a plurality of P-type semiconductor devices and N-type semiconductor devices that are alternately arranged in relation to each other. The top portions of the P-type and N-type semiconductor devices are combined with a ceramic cooling plane, and the bottom portions thereof are combined with a ceramic radiating plane.

In the cooling plane, a current output from a DC (direct current) power supply flows from the N-type semiconductor devices to the P-type semiconductor devices. Considering the above current flow as a flow of electrons, electrons flow from a P-type lower energy level to a N-type higher energy level.

Consequently, the temperature at places combining the top portions of the P-type and N-type semiconductor devices with the cooling plane decreases by absorbing the surrounding thermal energy and thereby a temperature of the cooling plane decreases.

Conversely, in the radiating plane, the current flows from the P-type semiconductor devices to the N-type semiconductor devices. Thus, the radiating plane is heated up by effects opposed to the above-mentioned.

As described above, a heating operation or cooling operation by a Peltier device can be controlled by varying a quantity of current flowing therethrough or altering the direction of the current. A Peltier control circuit controls a quantity or the direction of a current flowing through a Peltier device by detecting the temperature of a device, for example a laser diode in this example, combined with the Peltier device so that the temperature of the device is kept constant.

A conventional Peltier control circuit has a push-pull type driving circuit consisting of two pairs of transistors, arranged in a Darlington configuration. The driving circuit heats a Peltier device by outputting a current thereto. Conversely, the driving circuit cools a Peltier device by inputting current. Also, in order to prevent an over-current that could destroy a Peltier device or cause thermal runaway, the driving circuit has a current limiting circuit that limits a quantity of a current flowing through a Peltier device by limiting a base current applied to the output transistors. Conventionally, a resistor is used for the current limiting circuit. In order to prevent such thermal runaway, etc., the driving circuit has a dead zone in which the output transistors are turned OFF close to an alternating point between heating and cooling operations.

The control of alternation between heating and cooling operations is performed by comparing a voltage detected by a temperature sensor, which measures the operating temperature of a Peltier device, with a reference voltage a value of which is set within the dead zone. Therefore, in this case, it is impossible to control a temperature of a Peltier device when the voltage detected by the temperature sensor is within the dead zone.

The range of a dead zone is determined by the characteristics of a transistor ($V_{BE}$). Therefore, in the prior art there is a problem in that the difference in temperature between a sensing temperature and a control temperature occurs within a dead zone. Further, there is another problem in that the circuit loop stability for feedback control of the temperature of a Peltier device decreases in the dead zone due to the repetition between heating and cooling operations so that a loop oscillation may be caused.

Also, there is a problem in that when narrowing the dead zone by making the value of the current limiting resistor small, a loop oscillation alternately repeating between heating and cooling operations is more likely, and further, an over-current flows when supplying power.

Further, there is a problem in that an oscillation phenomena that is different from the above circuit loop oscillation occurs due to a structural factor of a conventional Peltier device. Namely, the combination of inductive elements of lead wires connected to an input and output of a laser diode and a capacitive element due to the structure of a Peltier device as described above, produces a resonant frequency point.

Therefore, conventionally, when using a laser diode module for high-speed optical communication, e.g., 2.4 G bit/sec, etc., there is a problem in that the prescribed oscillation phenomena occurs in the frequency range of optical communication.

SUMMARY OF THE INVENTION

To solve the above problems, the object of the present invention is to provide a Peltier control circuit that has a current limiting circuit with predetermined temperature characteristics by which the limitation of a current flowing through a Peltier device reaches a maximum value near room temperature. Thereby, a current applied to a Peltier device for heating and cooling operations is greatly limited or reduced near room temperature.

Also, the object of the present invention is to provide a Peltier control circuit that enables fine temperature control of a Peltier device near room temperature by reducing the difference between starting temperatures of heating and cooling operations.

Further, the object of the present invention is to provide a Peltier device that reduces or eliminates a stray-capacitive element due to the structure of a Peltier device so as to prevent an oscillation phenomena of an output so that the Peltier device can be applied to a laser diode module for high speed optical communication.

According to the present invention, there is provided a Peltier control circuit that detects the temperature of a device combined with a Peltier device and controls a current flowing through the Peltier device in accordance with a detected temperature so as to keep the temperature of the device at a predetermined value. The circuit has a temperature sensing section for detecting temperature of a device; a comparing section for comparing a temperature detection value detected by the temperature sensing section with a predetermined temperature reference value; a limiting section for providing a comparison output from the comparing section with the limitation of a current flowing through the Peltier device and providing the prescribed limitation of the current with predetermined temperature characteristics; and a driving section for providing the Peltier device with an input or output driving current in accordance with the comparison output via the limiting section.

The limiting section limits the input or output driving current in accordance with a variation in ambient temperature so as to compress a region of a temperature dead zone in which the input and output driving currents alternate with each other. The limiting section limits the output driving current by providing the comparison output from the comparing section to the driving section via a resistor having a positive temperature coefficient, and limits the input driving current by providing the comparison output from the comparing section to the driving section via a resistor having a negative temperature coefficient.

The resistor having a positive temperature coefficient is serially connected to a posistor and the resistor having a negative temperature coefficient is serially connected to a thermistor.

The comparing section includes a comparator for comparing a temperature detection voltage from the temperature sensing section with a predetermined reference voltage.

Also, according to the present invention, the comparing section includes a first comparator for comparing a temperature detection voltage from the temperature sensing section with a first reference voltage corresponding to a starting point for driving the output driving current and a second comparator for comparing a temperature detection voltage from the temperature sensing section with a second reference voltage corresponding to a starting point for driving the input driving current.

The difference between the first reference voltage and the second reference voltage is used to compress or expand a region of a temperature dead zone in which the input driving current alternates with the output driving current.

The limiting section limits the output driving current by providing a comparison output from the first comparator to the driving section via a resistor having a positive temperature coefficient, and limits the input driving current by providing a comparison output from the second comparator to the driving section via a resistor having a negative temperature coefficient.

Further, according to the present invention, there is provided a Peltier device having a cooling plane, a radiating plane and a plurality of Peltier elements made of semiconductor that are sandwiched between the cooling and radiating planes, the device is characterized by electrically combining the cooling plane with the radiating plane so as to eliminate a stray-capacitive element between the cooling and radiating planes. The electrical combination between the cooling and radiating planes is provided by coating at least one of the Peltier elements with metal. At least one of the Peltier elements is coated with metal so as to have the structure of the Peltier device durable.

According to the present invention, it is possible to reduce the difference between the operating temperature of a heating or cooling operation and a sensor temperature thereof by having starting points of the heating and cooling operations close to each other. The limiting section has temperature characteristics which provide the greatest limitation of a current flowing through the Peltier device at room temperature. Thereby, it is possible to largely limit a current flowing through the Peltier device near room temperature at which a circuit loop becomes unstable by e.g., circuit loop oscillation, etc. In this case, a current scarcely flows through the Peltier device even if alternating between heating and cooling operations. Therefore, even if a circuit loop oscillation occurs, since a driving current applied to the Peltier device is very small and thereby the Peltier device cannot effectively perform heating and cooling operations, the circuit loop is totally stable. Also, for the same reasons, when supplying power at which a circuit loop is unstable, the excess current does not flow trough the Peltier device.

Further, according to the present invention, it is possible to reduce or eliminate a stray-capacitive element due to the structure of the Peltier device. Thereby, a resonant point caused by a capacitive element due to the structure of the Peltier device and an inductive element due to a lead line of the laser diode mounted on the cooling plane disappears or is moved out of a used bandwidth.

BRIEF DESCRIPTION OF THE DRAWINGS

The present invention will be more clearly understood from the description as set forth below with reference to the accompanying drawings.

DESCRIPTION OF THE PREFERRED EMBODIMENTS

Before describing the preferred embodiments according to the present invention, examples of the related art are provided with reference to FIGS. 1(A) to 7.

Figure 1A:
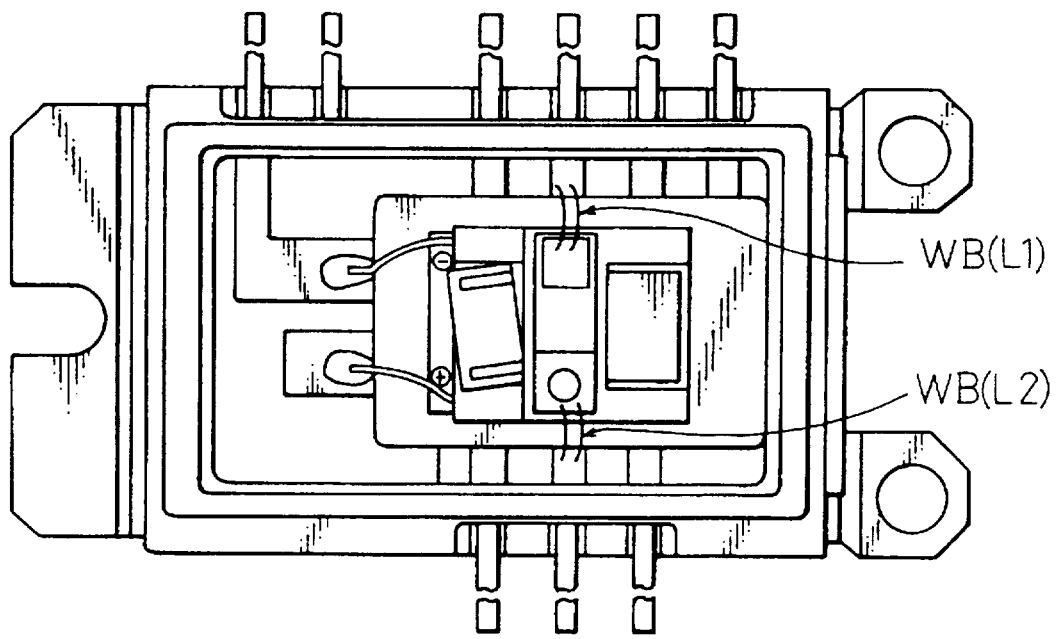
FIG. 1(A) is a top view of a laser diode module for high speed optical communication.

FIG. 1(A) is a top view of a laser diode module for high speed optical communication.

Figure 1B:
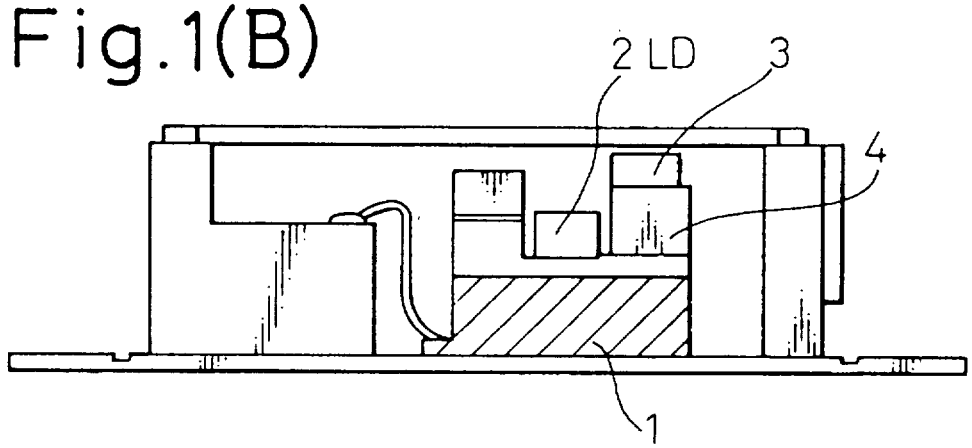
FIG. 1(B) is a side view of a laser diode module for high speed optical communication.

FIG. 1(B) is a side view of a laser diode module for high speed optical communication.

As shown in FIG. 1(B), a laser diode 2 is mounted on the top of the Peltier device 1 so as to emit a light beam. The Peltier device 1 performs a heating or cooling operation to fix the operating temperature of the laser diode 2.

Figure 2:
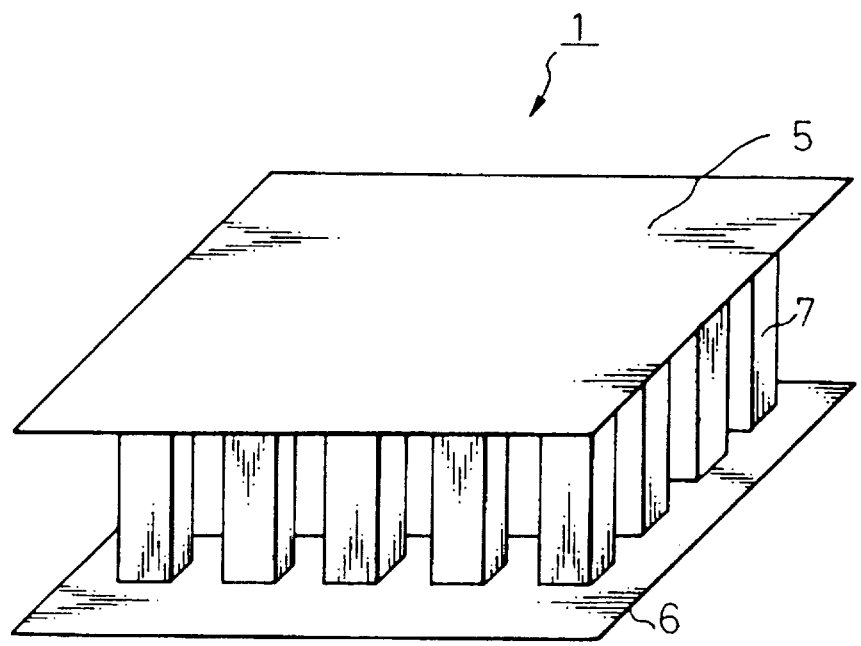
FIG. 2 is a perspective view of the conventional structure of a Peltier device used in a laser diode module.

FIG. 2 is a perspective view of the conventional structure of the Peltier device 1 used in a laser diode module.

Figure 3:
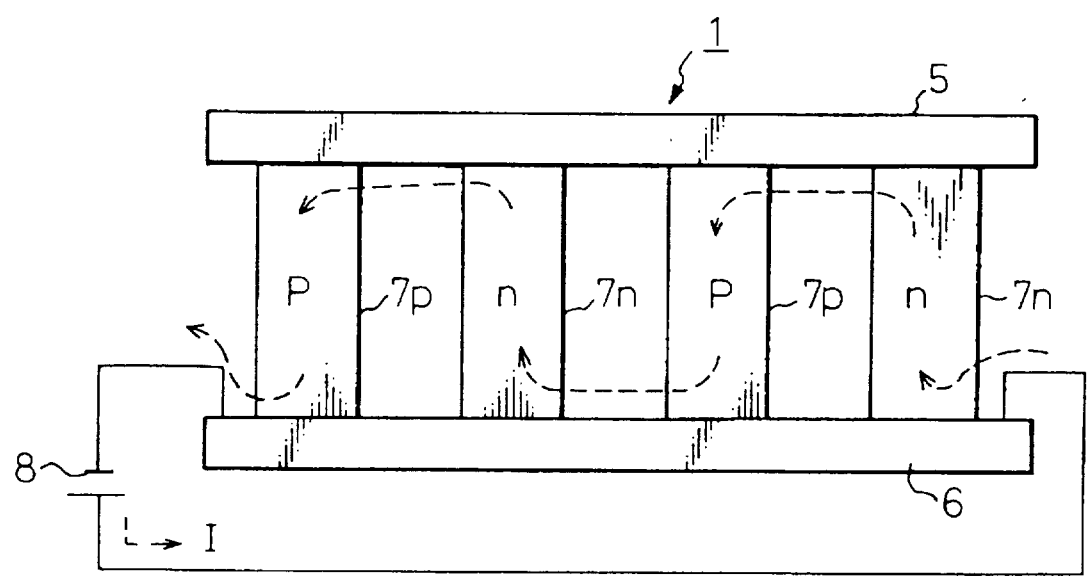
FIG. 3 is an explanatory view for explaining the operation of a thermoelectric heat pump due to the structure of a Peltier device.

FIG. 3 is an explanatory view for explaining the operation of a thermoelectric heat pump based on the structure of a Peltier device.

In FIG. 2, the Peltier device 1 has a plurality of P-type semiconductor devices 7p and N-type semiconductor devices 7n that are alternately arranged in relation to each other. The top portions of the P-type and N-type semiconductor devices 7p and 7n are combined with a ceramic cooling plane 5, and the bottom portions thereof are combined with a ceramic radiating plane 6.

As shown in FIG. 3, in the cooling plane 5 the current I output from DC (direct current) power supply 8 flows from the N-type semiconductor devices 7n to the P-type semiconductor devices 7p. Considering the above current flow as a flow of electrons, electrons flow from a P-type lower energy level to a N-type higher energy level.

Consequently, the temperature of a portion combining the N-type semiconductor devices 7n and the P-type semiconductor devices 7p with the cooling plane 5 (connecting taps) decreases by absorbing the surrounding thermal energy and thereby the temperature of the cooling plane 5 decreases. Conversely, in the radiating plane 6 the current I flows from the P-type semiconductor devices 7p to the N-type semiconductor devices 7n. Thus, the radiating plane 6 is heated up by reverse operations described above. Incidentally, if connecting the DC power supply 8 in the reverse direction and thereby changing the direction of the current I (not shown in FIG. 3), the cooling plane 5 is heated up and the radiating plane 6 is cooled.

Figure 4:
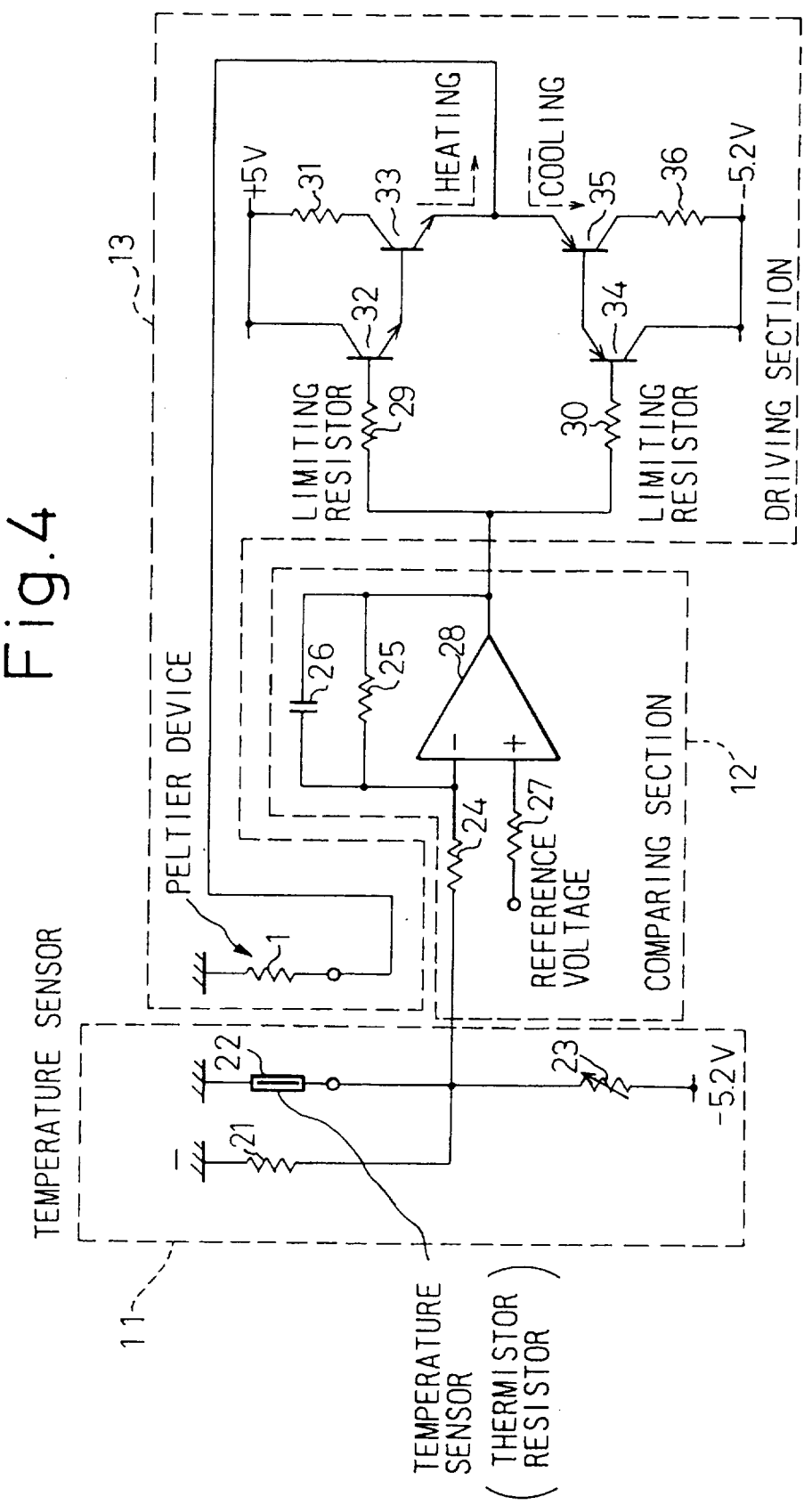
FIG. 4 is a circuit diagram showing an example of a conventional Peltier control circuit.

FIG. 4 is a circuit diagram showing an example of a conventional Peltier control circuit.

Figure 5:
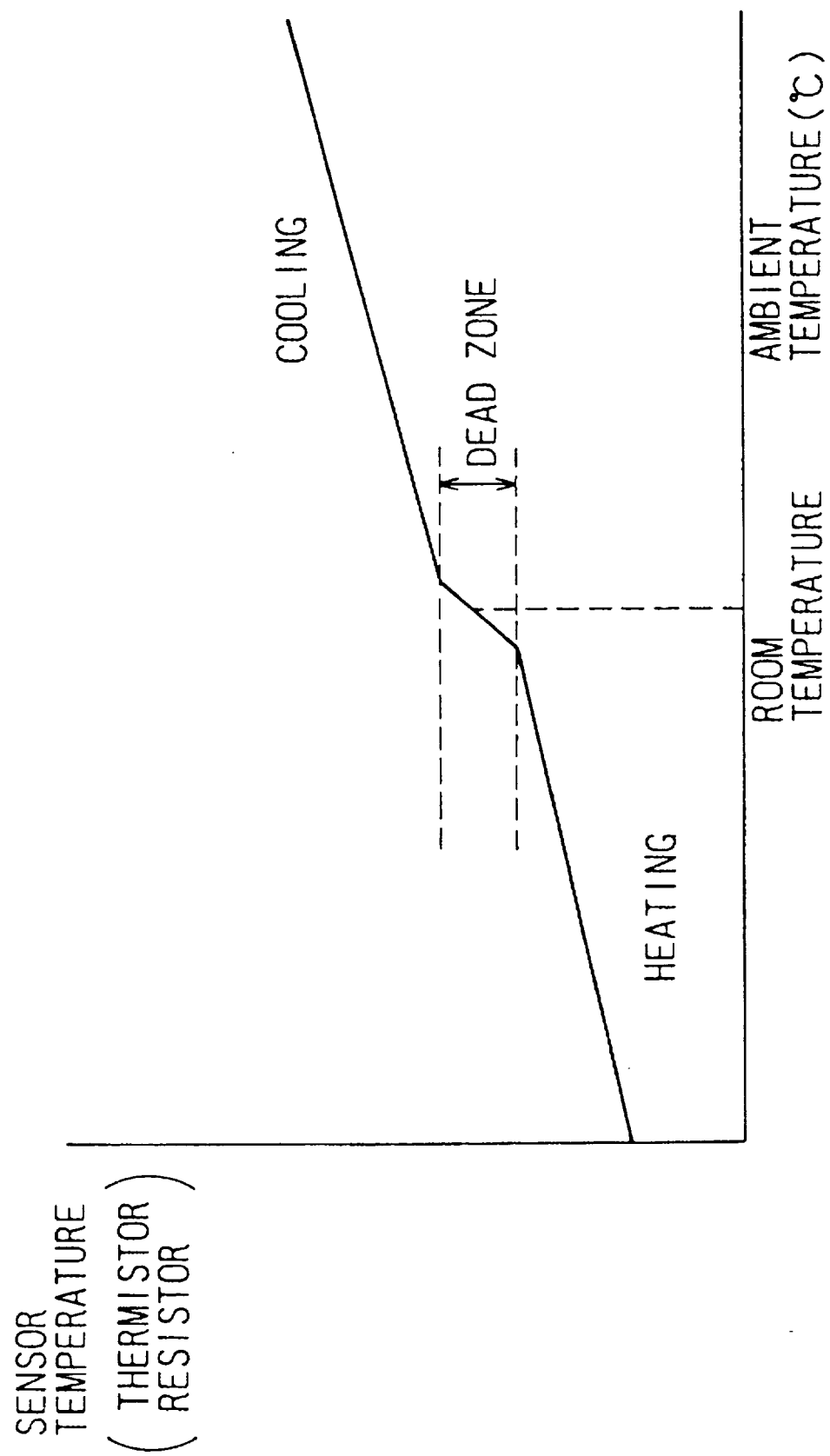
FIG. 5 is an explanatory view of a temperature dead zone in the conventional Peltier control circuit.

FIG. 5 is an explanatory view of a temperature dead zone in the conventional Peltier control circuit.

Figure 6:
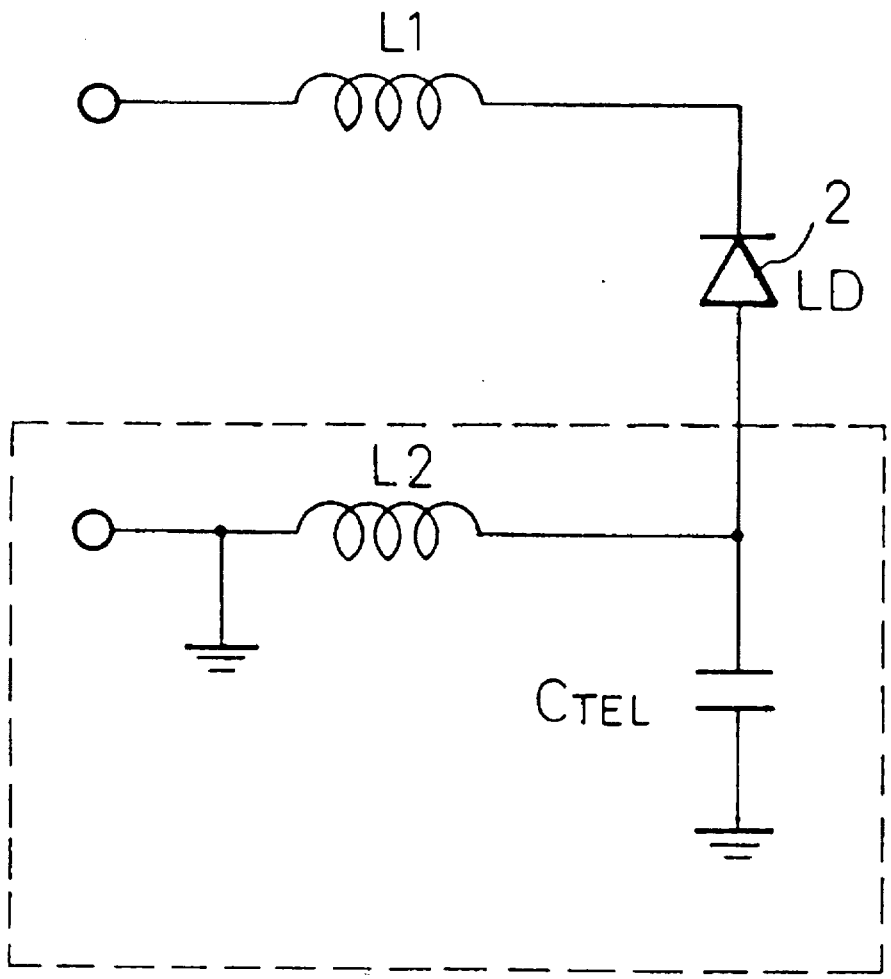
FIG. 6 is an equivalent circuit diagram corresponding to a wire bounding portion of a laser diode.

FIG. 6 is an equivalent circuit diagram corresponding to a wire bounding portion of a laser diode.

As described above, a heating operation or cooling operation of a Peltier device can be controlled by varying a quantity of a current or changing the direction thereof. A Peltier control circuit controls a quantity or the direction of a current flowing through the Peltier device by detecting a temperature of a device, e.g., a laser diode in this example, etc., that is combined with a Peltier device. Consequently, the temperature of a device is fixed by using a negative feed back loop control described above.

In FIG. 4, the thermistor 22 in the temperature sensor 11 detects the temperature of a laser diode. A current detected by the thermistor 22 is provided to the variable resistor 23 for fine controlling the temperature together with a predetermined bias current flowing via the resistor 21. The variable resistor 23 converts those currents into a voltage corresponding to a detection temperature. The comparing section 12 compares the voltage with a reference voltage corresponding to a reference temperature by using an operational amplifier 28, and provides a comparison output signal to the driving section 13 at the next stage. The comparing section 12 uses a generally used inverted amplifier that consists of the operational amplifier 28 and resistors 24 and 25. The capacitor 26 is used for preventing an abrupt transition of an output of the operational amplifier by performing the integrating operation.

The driving section 13 uses a push-pull type output circuit that consists of two pairs of the transistors 32, 33 and 34, 35, and the transistors 32, 33 or 34, 35 in each pair are connected by using a Darlington connection. The output circuit heats the Peltier device 1 by outputting a current that flows through the Peltier device 1. Conversely, the output circuit cools the Peltier device 1 by inputting the current. Also, in order to prevent an over-current that could destroy the Peltier device 1 or cause a thermal runaway, the driving section 13 has a limiting circuit. The limiting circuit limits the quantity of a current provided to the Peltier device 1. Conventionally, the limiting resistors 29 and 30 as shown in FIG. 4 are used as the limiting circuit.

In a conventional Peltier control circuit, in order to prevent such a thermal runaway, etc., the driving section 13 has a temperature dead zone that makes the output transistors 33 and 35 both OFF close to an alternating point between heating and cooling operations. FIG. 5 shows an example of a temperature dead zone in the conventional Peltier control circuit.

However, the alternating control between heating and cooling operations is performed by comparing a voltage detected by the temperature sensor section 11 with a reference voltage that is set within a dead zone in the comparing section 12. In this case, there is a problem in that it is impossible to control the temperature of Peltier device 1 when the voltage detected by the temperature sensor section 11 is within the dead zone.

The range of the dead zone is determined by the characteristics of a transistor ($V_{BE}$). Therefore, there is a problem in that a temperature detection error between a sensor temperature and a control temperature occurs in a range of the dead zone. Further, there is another problem in that the circuit loop stability is reduced in the region because an alternation between heating and cooling operations is repeated so that a loop oscillation could be caused.

Also, there is a problem in that by narrowing the temperature dead zone by making the value of the limiting resistors 29 and 30 smaller, the loop oscillation wherein heating or cooling operation is alternately repeated is more encouraged. In this case, another problem is caused in that when supplying power, an over-current flows into a resistor.

Further, there is a problem in that an oscillation phenomena that is different from the above loop oscillation occurs in relation to a structual factor of a conventional Peltier device as shown in FIG. 2.

FIG. 6 shows an equivalent circuit of a wire bound portion in the laser diode module shown in FIGS. 1(A) and 1(B).

In FIG. 6, inductors L1 and L2 respectively direct inductive elements of lead wires connected to an input and output of the laser diode 2. The capacitor $C_{TEL}$ directs a capacitive element to ground that is caused due to the structure of a Peltier device. A resonant frequency f in the circuit surrounded by a dotted line in the Figure is determined by an equation $f= 1/(2\pi \times (L2 \times C_{TEL})^{1/2})$. By substituting the observation values L2=1.4 mH and $C_{TEL}$=3 pF for the same signs in the equation, the resonance frequency f is 2.46 GHz.

Figure 7:
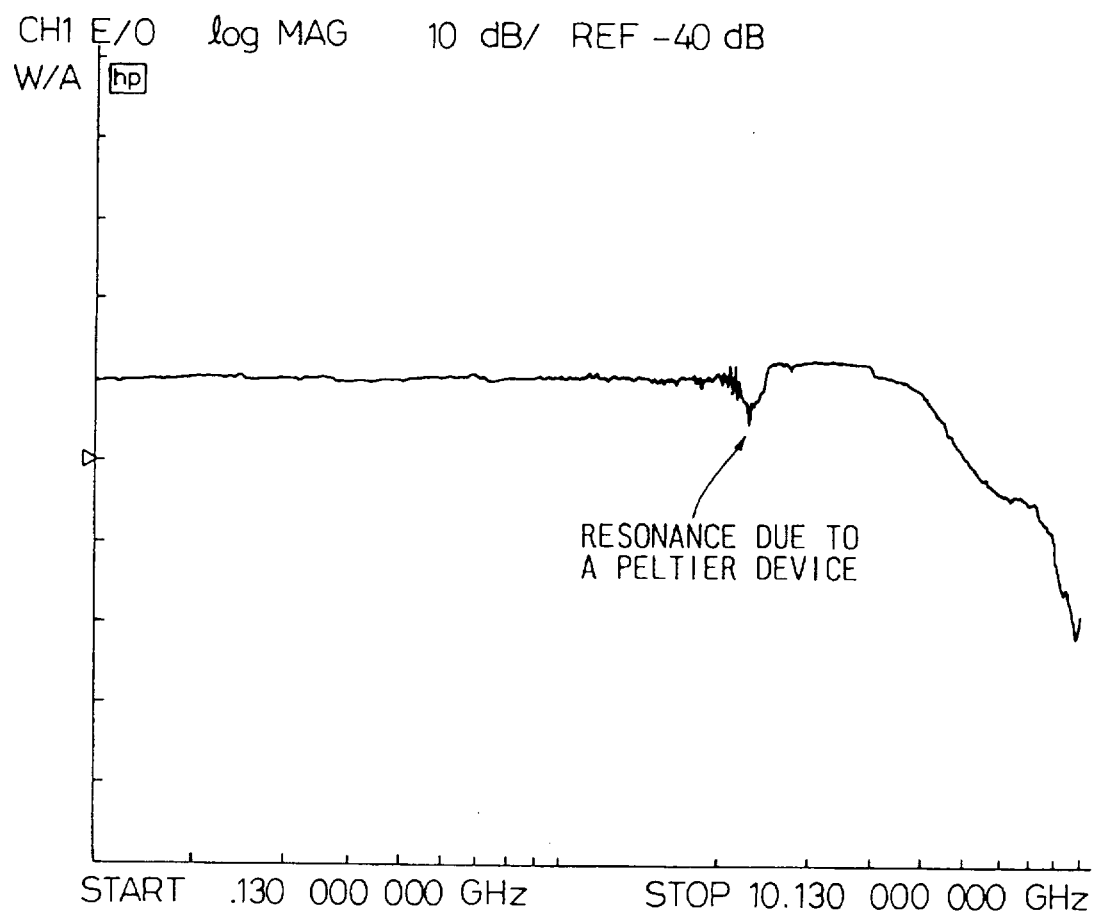
FIG. 7 is a diagram showing an example of frequency characteristics of an optical output power output from a laser diode module.

FIG. 7 is a diagram showing an example of the frequency characteristics of an optical output power output from a laser diode module shown in FIGS. 1(A) and 1(B).

From FIG. 7, it is found that a resonant point due to the capacitive element $C_{TEL}$ exists.

As described above, conventionally when using a laser diode module for high-speed optical communication, e.g., 2.4 G bit/sec, etc., there is a problem in that an oscillation phenomena occurs in a frequency range used for an optical communication.

Figure 8:
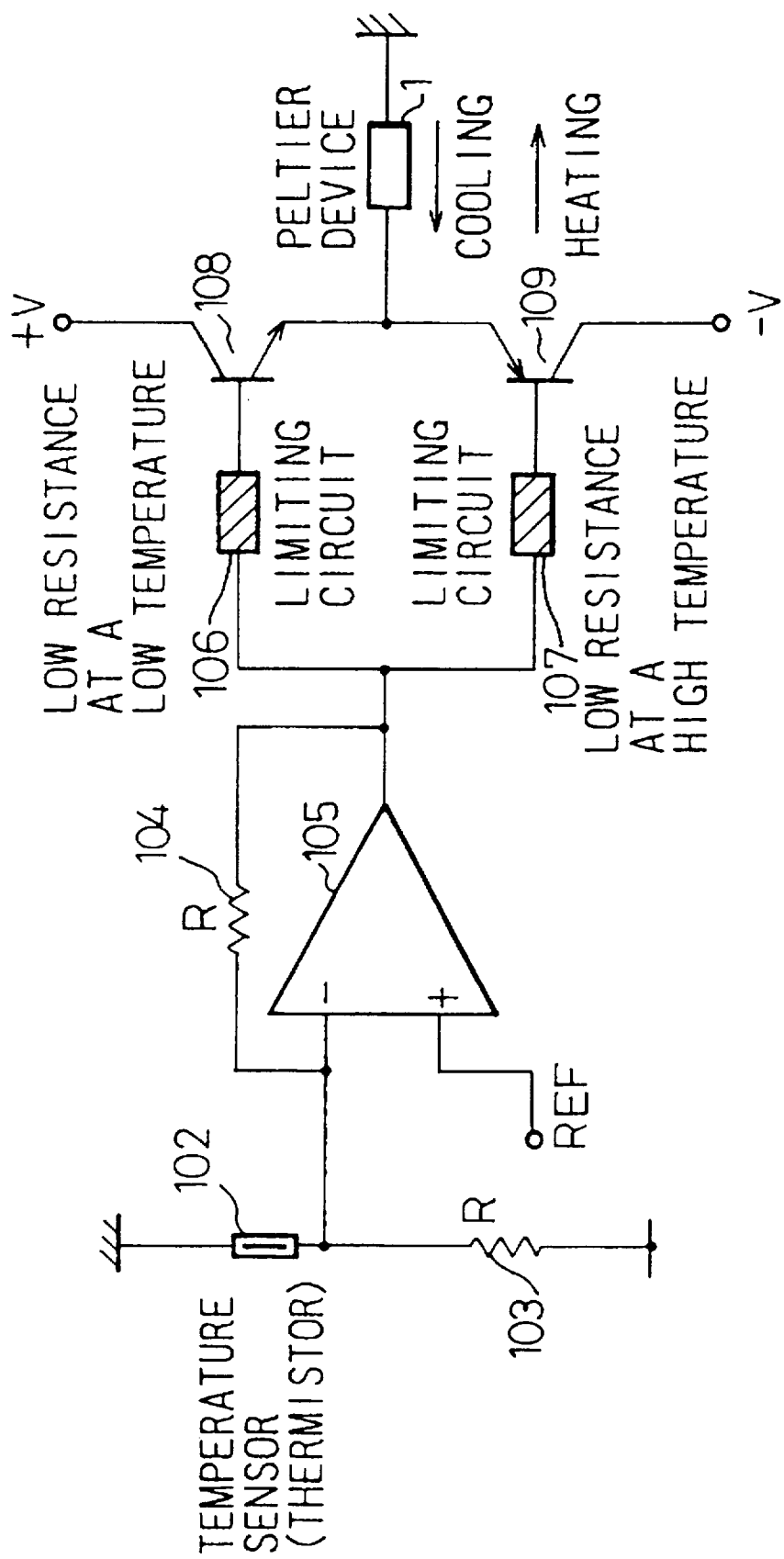
FIG. 8 is a circuit diagram showing the first preferred embodiment of a Peltier control circuit according to the present invention.

Next, FIG. 8 is a circuit diagram showing the first preferred embodiment of a Peltier control circuit according to the present invention.

A basic circuit configuration of a Peltier control circuit is almost the same as in FIG. 4. The configuration in FIG. 8 is simplified more than that in FIG. 4 so as to more clarify the present invention. Therefore, each operation of the circuit in FIG. 8 is not explained in the following. Please see the explanation of the corresponding circuit section in FIG. 4.

In FIG. 8, the limiting circuits 106 and 107 characterize the present invention. The limiting circuit 106 limits a base current applied to the output transistor 108 that controls an output of a driving current. The output drive current heats the Peltier device 1. The limiting circuit 107 limits a base current applied to the output transistor 109 that controls an input of a driving current. The input current cools the Peltier device 1.

As shown in FIG. 8, the limiting circuit 106 consists of a resistor having a positive temperature coefficient. The temperature characteristics of the resistor indicate low resistance at a low temperature. Conversely, the limiting circuit 107 consists of a resistor having a negative temperature coefficient. The temperature characteristics of the resistor indicate low resistance at a high temperature.

Figure 9:
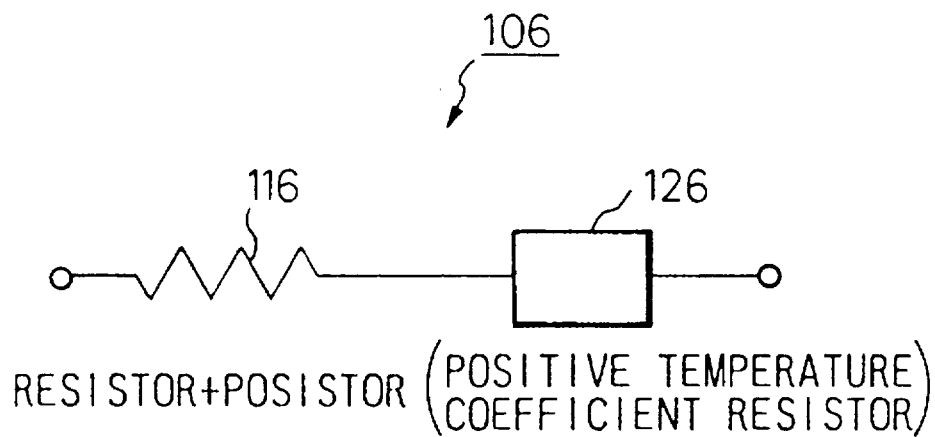
FIG. 9 is a block diagram showing an example of a resistor having a positive temperature coefficient that is used as a limiting circuit.

FIG. 9 is a block diagram showing an example of a resistor having a positive temperature coefficient that is used as a limiting circuit.

Figure 10:
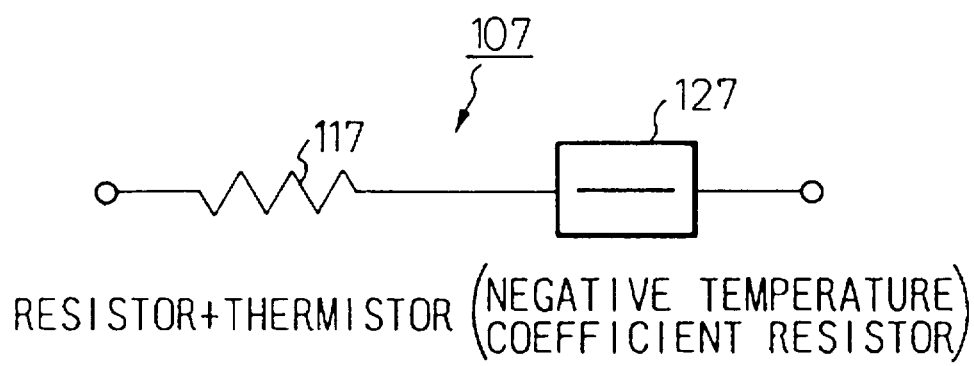
FIG. 10 is a block diagram showing an example of a resistor having a negative temperature coefficient that is used as another limiting circuit.

FIG. 10 is a block diagram showing an example of a resistor having a negative temperature coefficient that is used as another limiting circuit.

Figure 11:
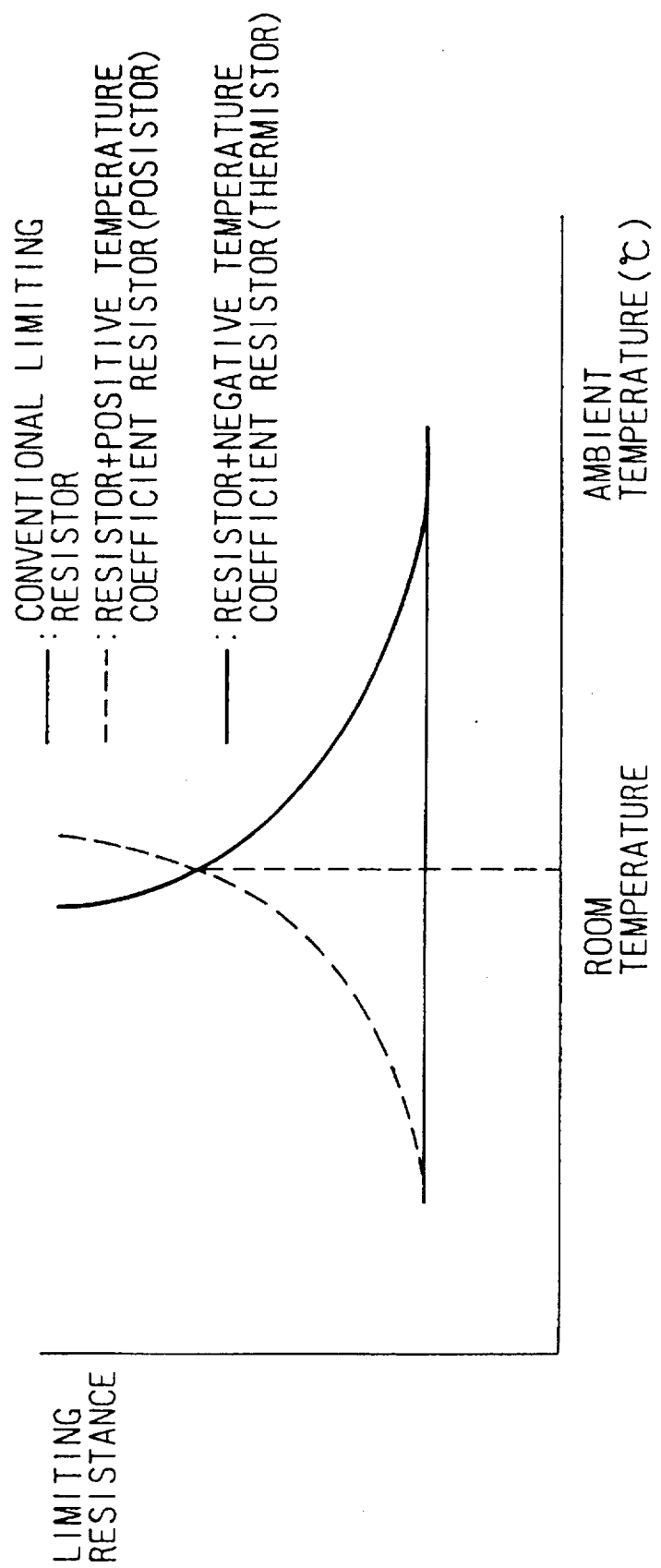
FIG. 11 is a diagram showing an example of temperature-resistance characteristics of limiting circuits shown in FIGS. 9 and 10.

FIG. 11 is a diagram showing an example of temperature-resistance characteristics of limiting circuits shown in FIGS. 9 and 10.

In FIG. 9, a posistor having a positive temperature coefficient is serially connected with a conventional output current limiting resistor 116. In FIG. 10, a thermistor having a negative temperature coefficient is serially connected with a conventional output current limiting resistor 117.

In FIG. 11, as shown by a fine line, in a conventional limiting circuit that consists of only a resistor (see FIG. 4), the resistance of the conventional limiting circuit does not change with temperature. In contrast, a limiting circuit according to the present invention includes a resistance having a positive or negative temperature coefficient. The former has resistance-temperature characteristics as shown by a dotted curved line and the latter has resistance-temperature characteristics as shown by a thick curved line.

In this case, a reference voltage is set to a value corresponding to a crossing point at which the dotted curved line intersects the thick curved line at an ambient temperature 25° C.

Accordingly, a control current applied to the Peltier device 1 largely decreases even if alternating between heating and cooling operations near an ambient temperature 25° C. Further, a current is greatly limited when supplying power at ordinary temperature, at which a loop is generally unstable.

Figure 12:
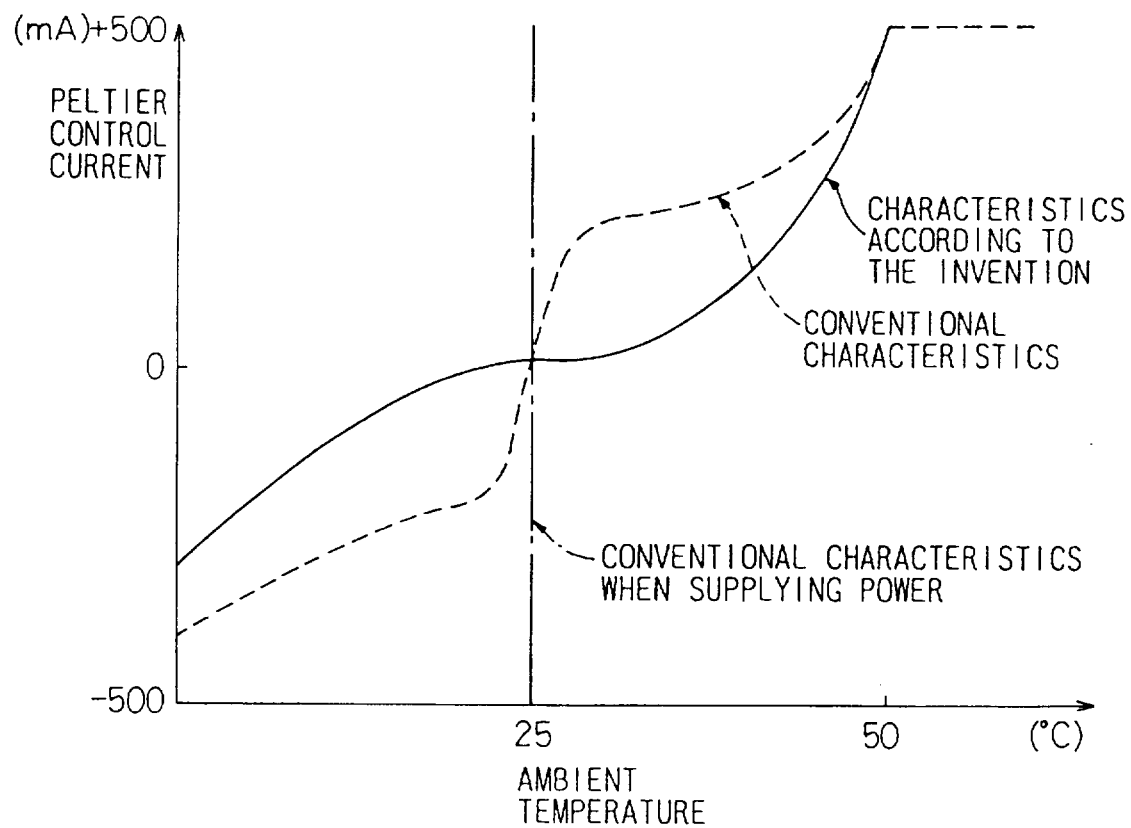
FIG. 12 is a diagram showing an example of ambient temperature-Peltier control current characteristics of a Peltier control circuit shown in FIG. 8.

FIG. 12 is a diagram showing an example of ambient temperature-Peltier control current characteristics of the Peltier control circuit shown in FIG. 8.

Figure 13:
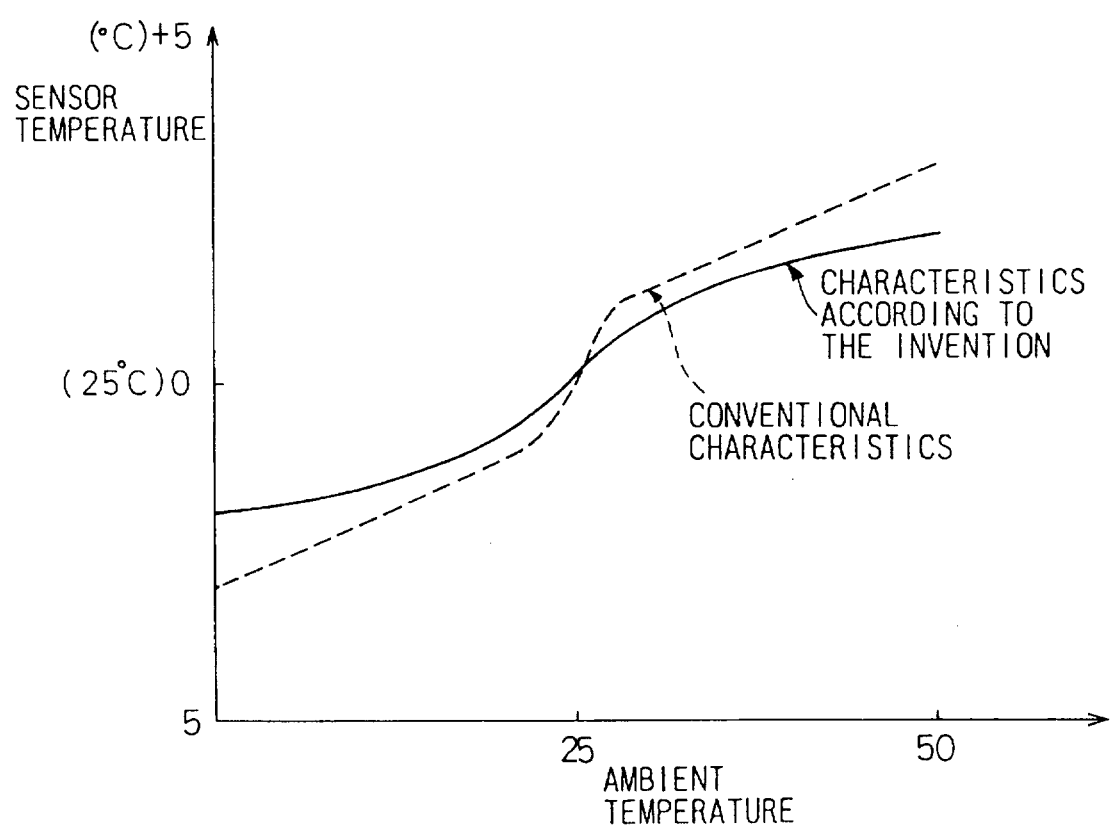
FIG. 13 is a diagram showing an example of ambient temperature-sensor temperature characteristics of a Peltier control circuit shown in FIG. 8.

FIG. 13 is a diagram showing an example of ambient temperature-sensor temperature characteristics of the Peltier control circuit shown in FIG. 8.

In FIGS. 12 and 13, a dotted line shows the characteristics of a conventional Peltier control circuit as shown in FIG. 4 and a solid line shows the characteristics of a Peltier control circuit of the invention. As shown in FIGS. 12 and 13, it is found that according to the present invention a dead zone is compressed and thereby it is possible to keep a temperature of a laser diode device combined with a Peltier device, constant.

By the way, in FIG. 11, each control temperature for a heating operation and a cooling operation can be individually varied. This can be realized by using a negative temperature coefficient resistor (thermistor) as a part of a current limiting resistor of the limiting circuit 106 or using a positive temperature coefficient resistor (posistor) as a part of a current limiting resistor of the limiting circuit 107. Further, by adjusting a reference voltage applied to the comparator 105, it is possible to desirably change the limits of a dead zone.

As shown in FIG. 13, it is possible to precisely compress a dead zone. Although the possibility for causing loop oscillation becomes larger in this case, the overall loop is stable, because a limiting resistance becomes larger and a quantity of an alternating current is very small near to an alternating point. Also, at an alternating point within a dead zone the transistors 108 and 109 are both ON and a dark current flows through the transistors 108 and 109. In such a case, power consumption can be reduced by a large limiting resistance. Furthermore, it is possible to prevent the Peltier device 1 from being destroyed by limiting current when supplying power at an ordinary temperature.

Figure 14:
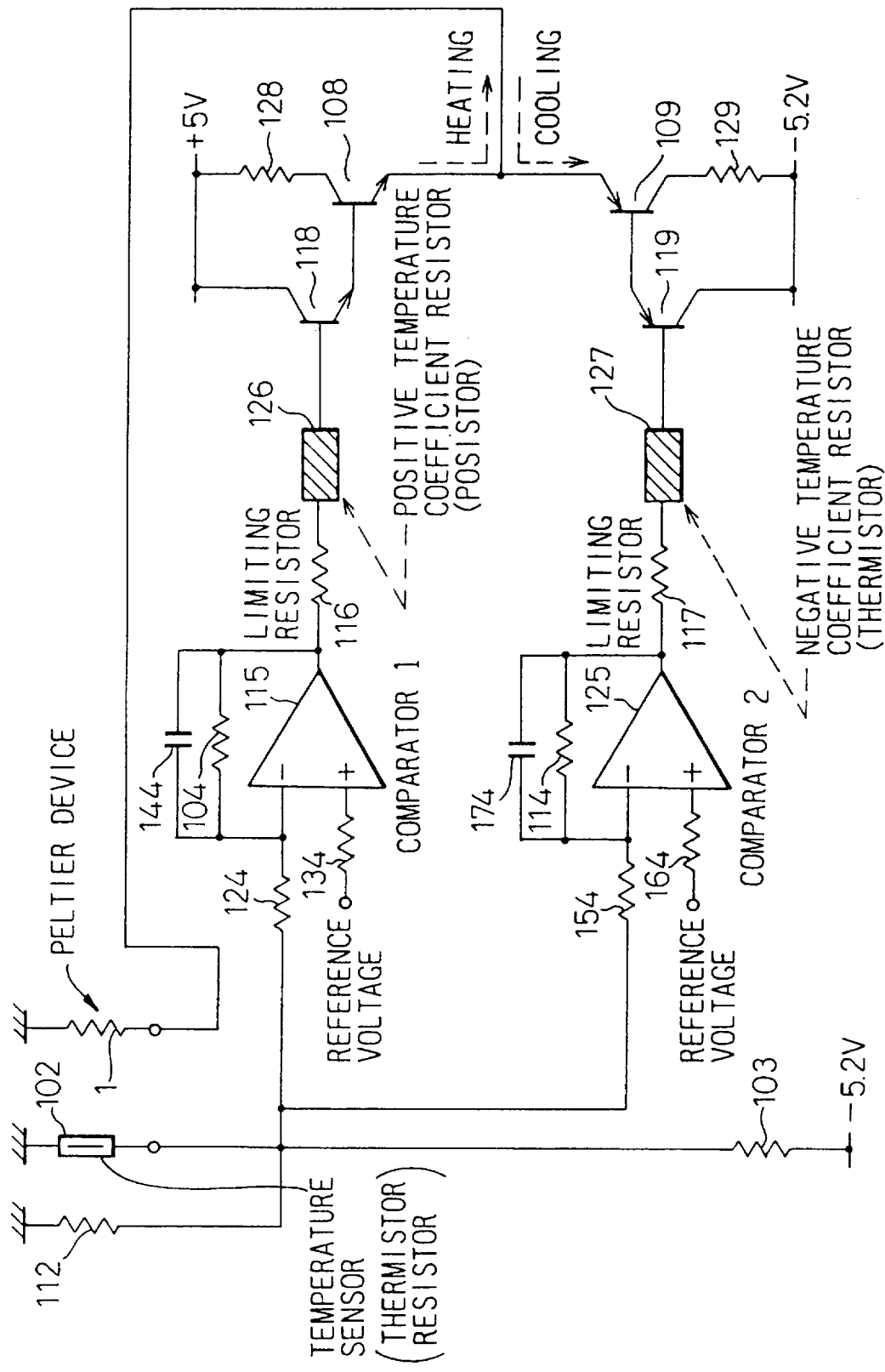
FIG. 14 is a circuit diagram showing the second preferred embodiment of a Peltier control circuit according to the present invention.

FIG. 14 is a circuit diagram showing the second preferred embodiment of a Peltier control circuit according to the present invention.

In FIG. 14, the difference between a second preferred embodiment and a first preferred embodiment is in that the comparators 115, 125 and the reference voltages 1, 2 are individually arranged for each input or output Peltier control current.

In this circuit configuration, a dead zone can be desirably changed by setting circuit parameters, e.g., a reference voltage, limiting resistor, etc. In contrast thereto, in a first embodiment shown in FIG. 1, the compression of a dead zone is determined by the temperature characteristics of the limiting circuits 106 and 107.

Figure 15:
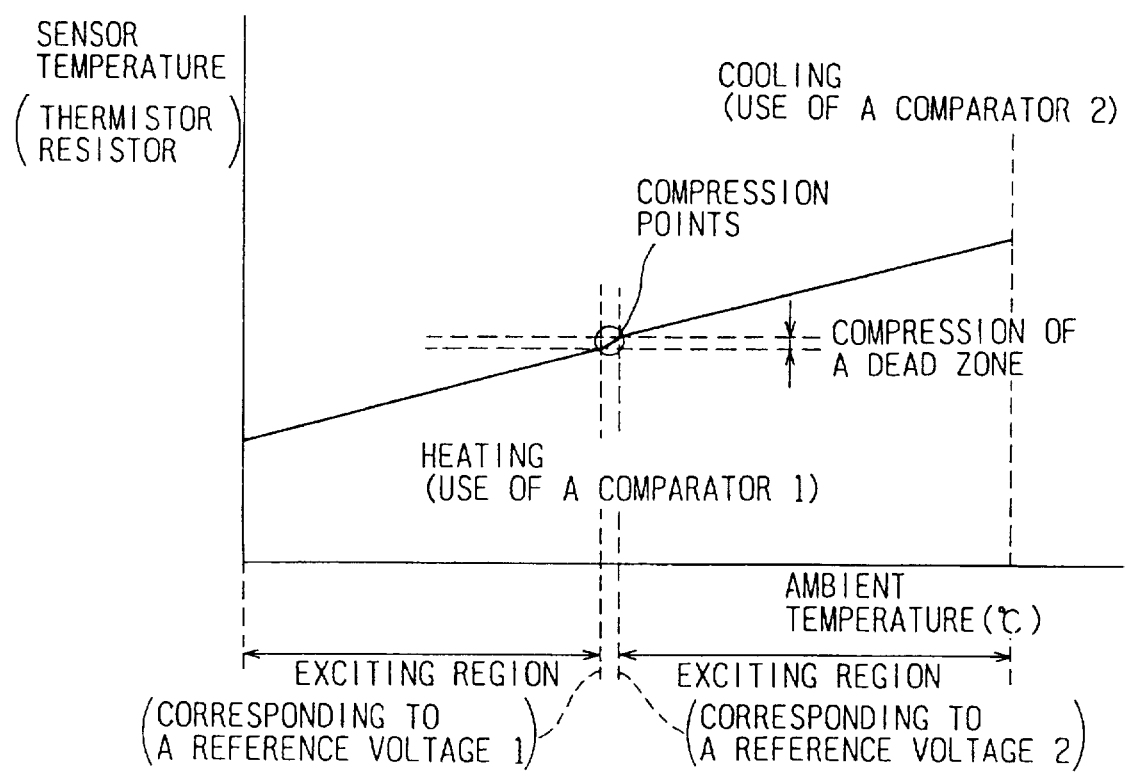
FIG. 15 is a diagram showing an example of the compression of a dead zone of a Peltier control circuit shown in FIG. 14.

FIG. 15 is a diagram showing an example of the compression of a dead zone of a Peltier control circuit shown in FIG. 14.

Figure 16:
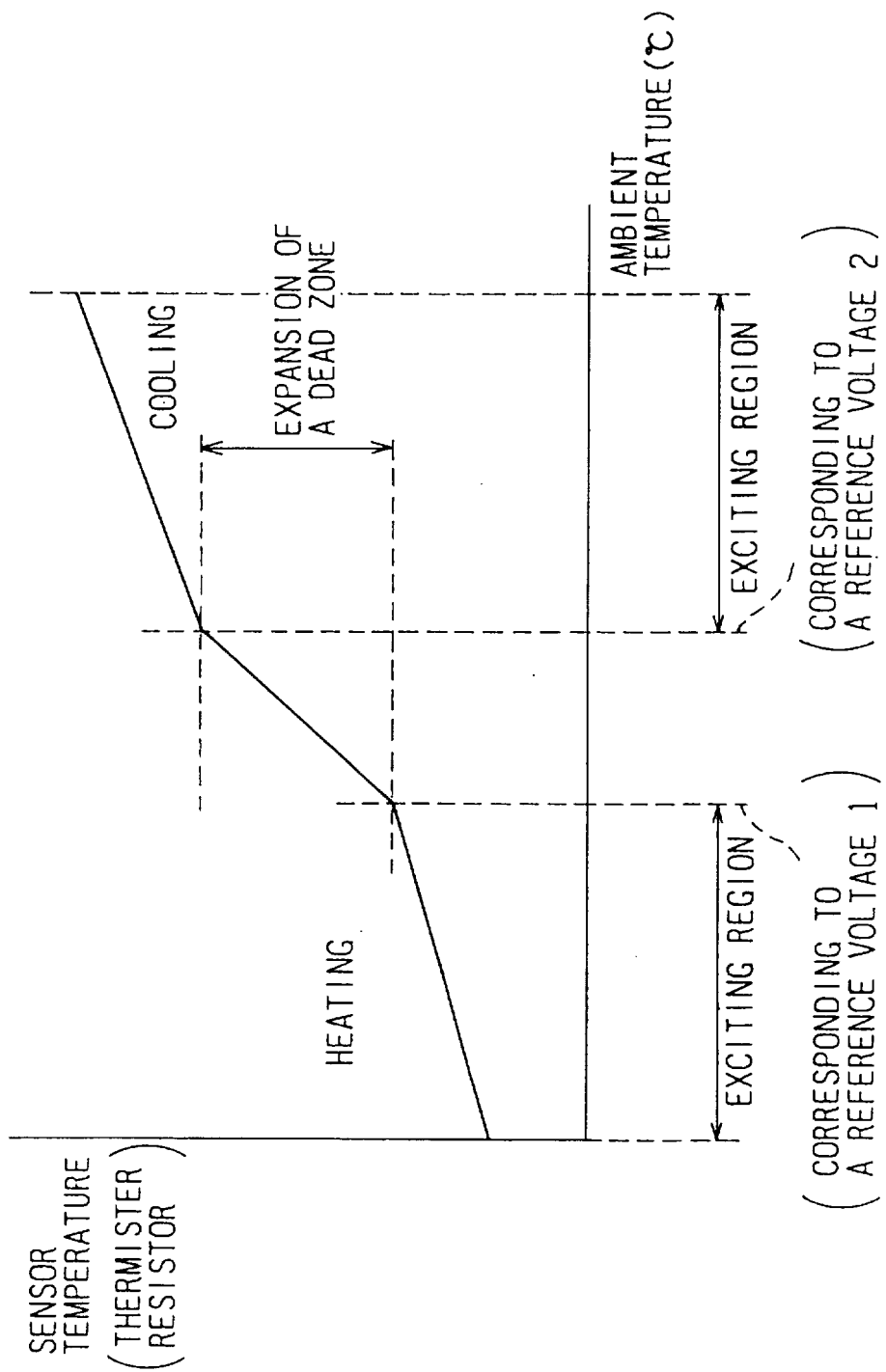
FIG. 16 is a diagram showing an example of the expansion of a dead zone of a Peltier control circuit shown in FIG. 14.

FIG. 16 is a diagram showing an example of the expansion of a dead zone of a Peltier control circuit shown in FIG. 14.

In FIG. 14, a heating operation of the Peltier device 1 is performed by using the comparator 115 and the reference voltage 1, and the transistor 108 is controlled by an output of the comparator 115. A cooling operation of the Peltier device 1 is performed by using the comparator 125 and the reference voltage 2, and the transistor 109 is controlled by an output of the comparator 125. The above two operations are performed independently of each other, and thereby a temperature dead zone can be desirably realized. The Peltier control circuit in this embodiment is effective when controlling a wide range of temperature or using a device that can be controlled in the limits of a temperature excluding near room temperature. For the same reason as described above, the Peltier control circuit can also control the temperature of a laser diode with very small power consumption.

Figure 17:
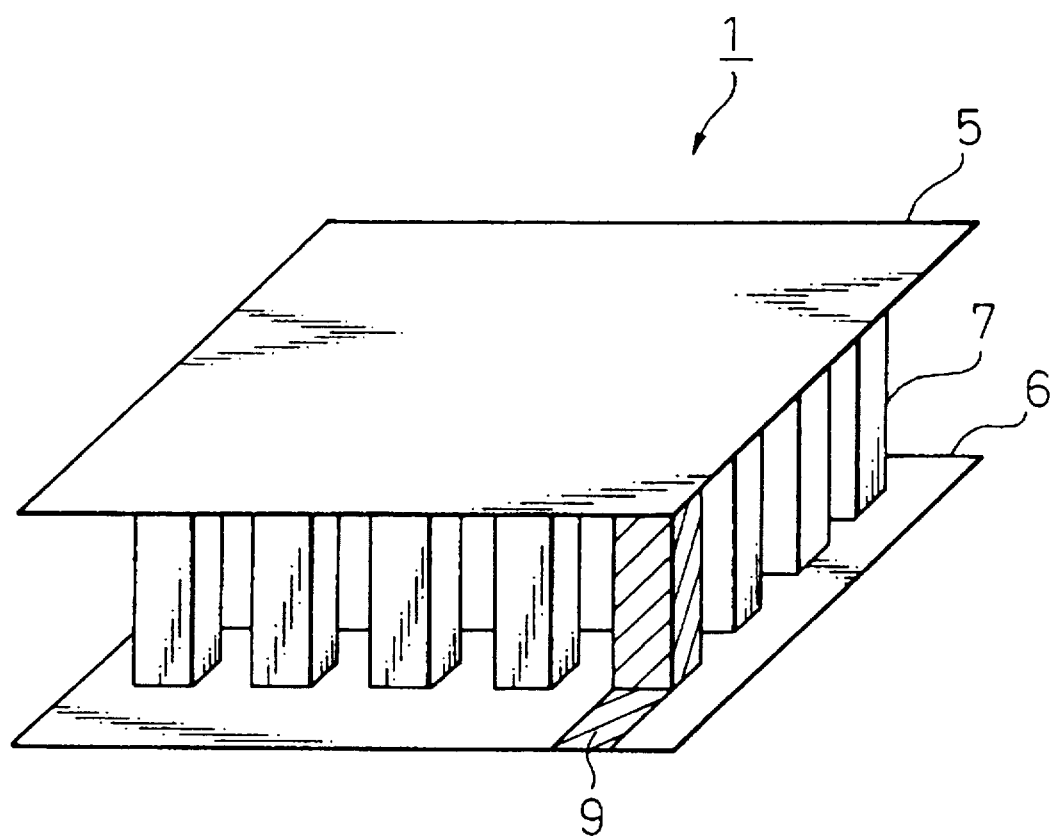
FIG. 17 is a perspective view showing an example of the basic structure of a Peltier device according to the present invention.

FIG. 17 is a perspective view showing an example of the basic structure of a Peltier device according to the present invention.

In FIG. 17, a stray-capacitive element (see $C_{TEL}$ in FIG. 6) due to a sandwich structure of the Peltier device 1 is reduced by electrically connecting the cooling plane 5 with the heating plane 6 by using metal 9.

Figure 18:
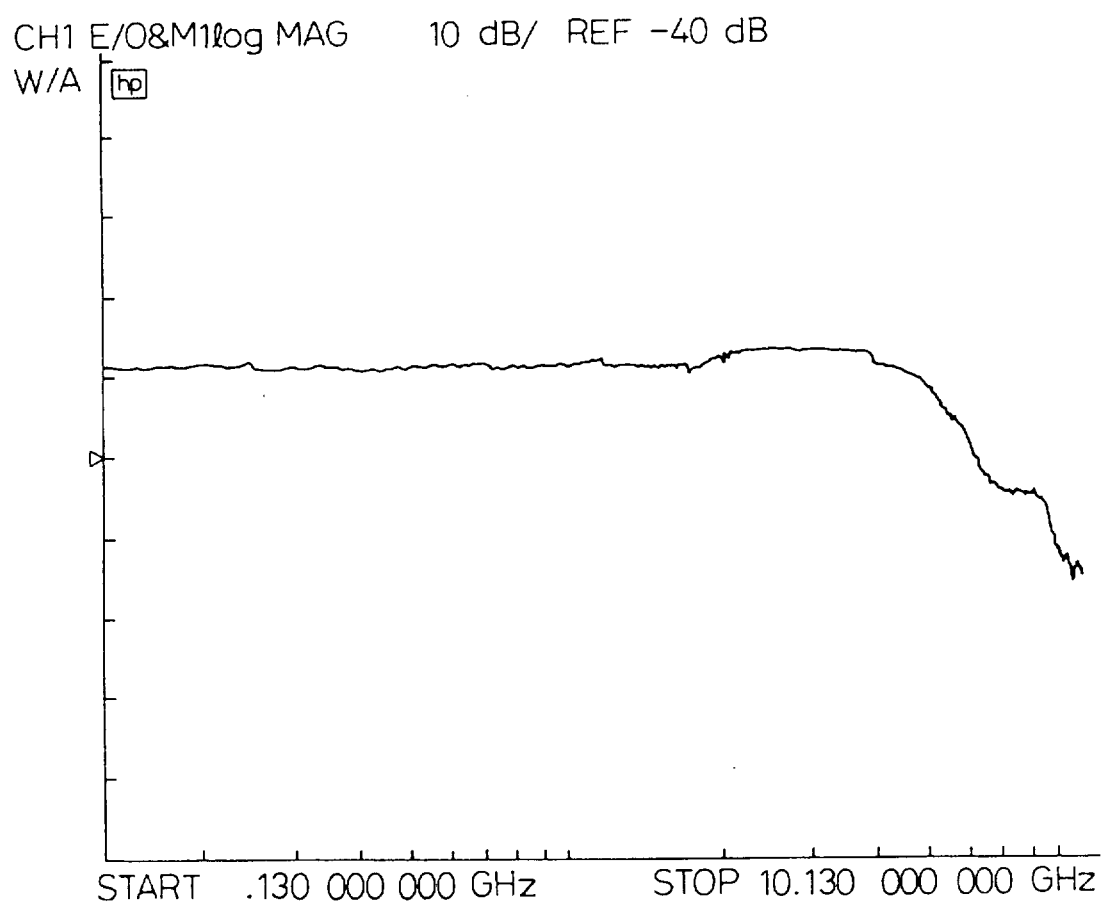
FIG. 18 is a diagram showing an example of frequency characteristics of a laser diode module using the structure of a Peltier device shown in FIG. 17.

FIG. 18 is a diagram showing an example of the frequency characteristics of a laser diode module using the structure of a Peltier device shown in FIG. 17.

Comparing the above characteristics with the conventional characteristics shown in FIG. 7, it is found that an oscillation phenomena is clearly reduced or eliminated within a used bandwidth and a dip portion in the frequency characteristics shown in FIG. 7 is remarkably improved.

Figure 19:
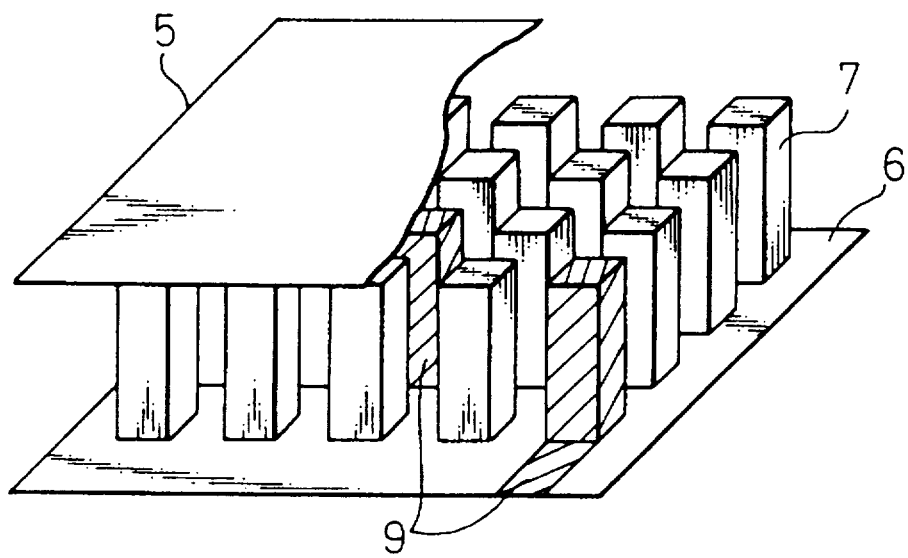
FIG. 19 is a diagram showing an embodiment of the structure of a Peltier device according to the present invention.

FIGS. 19 is a diagram showing an embodiment of the structure of a Peltier device according to the present invention.

Figure 20:
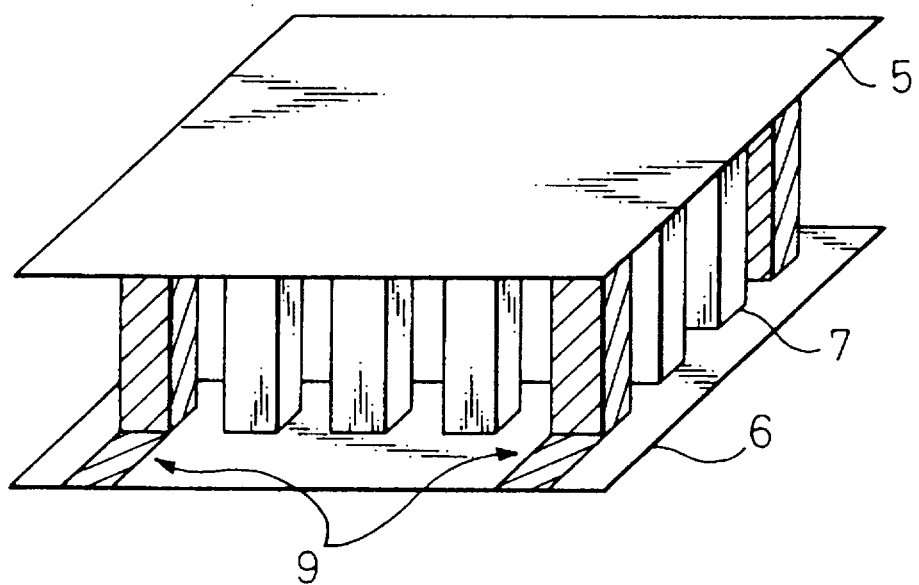
FIG. 20 is a diagram showing another embodiment of the structure of a Peltier device according to the present invention.

FIGS. 20 is a diagram showing another embodiment of the structure of a Peltier device according to the present invention.

FIG. 19 shows a case wherein a plurality of metal portions 9 are arranged in a Peltier device based on e.g., an experiment or the distinctive feature of the structure, etc., so as to improve the frequency characteristics of an output of a laser diode module.

FIG. 20 shows another case that metal portions 9 are arranged at four corners of a Peltier device so as to improve the frequency characteristics of an output of a laser diode module and further strengthen the structure of a laser diode module.

As described above, according to the present invention, it is possible to compress a temperature dead zone and keep a temperature of the laser diode device constant by using a resistor having a positive temperature coefficient and using a resistor having a negative temperature coefficient.

Also, it is possible to desirably vary the limits of a temperature dead zone by enabling two kinds of resistance-temperature characteristics to be set individually, or by independently adjusting two sets of comparator and reference voltages.

Further, according to the present invention, it is possible to precisely control the temperature of a laser diode module by compressing a dead zone.

Also, it is possible to reduce power consumption by making a current limiting resistance large close to room temperature and an alternating point.

Furthermore, according to the present invention, it is possible to reduce or eliminate a stray-capacitive element due to a sandwich structure of the Peltier device by electrically connecting the cooling plane with the heating plane by using metal.

Also, it is possible to further improve the frequency characteristics and further strengthen the structure of a laser diode module by having at least one metal portion arranged in a Peltier device.

What is claimed is:

1. A Peltier control circuit that detects a temperature of a device combined with a Peltier device and controls a current flowing through the Peltier device in accordance with the temperature detected so as to keep the temperature of the device at a predetermined value, the circuit comprising:

a temperature sensing section for detecting said temperature of a device;

a comparing section for comparing a temperature detection value detected by said temperature sensing section with a predetermined temperature reference value;

a limiting section for providing a comparison output from said comparing section with the limitation of a current flowing through the Peltier device and providing said limitation of the current with predetermined temperature characteristics; and a driving section for providing the Peltier device with an input or output driving current in accordance with said comparison output via said limiting section.

2. A Peltier control circuit as set forth in claim 1, wherein said limiting section limits said input or output driving current in accordance with the variation of an ambient temperature so as to compress a region of a temperature dead zone in which said input driving current alternates with said output driving current.

3. A Peltier control circuit as set forth in claim 2, wherein said comparing section includes a comparator for comparing a temperature detection voltage from said temperature sensing section with a predetermined reference voltage.

4. A Peltier control circuit as set forth in claim 3, wherein said limiting section limits said output driving current by providing the comparison output from said comparing section to said driving section via a resistor having a positive temperature coefficient.

5. A Peltier control circuit as set forth in claim 3, wherein said limiting section limits said input driving current by providing the comparison output from said comparing section to said driving section via a resistor having a negative temperature coefficient.

6. A Peltier control circuit as set forth in claim 3, wherein said limiting section limits said output driving current by providing the comparison output from said comparing section to said driving section via a resistor having a positive temperature coefficient, and limits said input driving current by providing the comparison output from said comparing section to said driving section via a resistor having a negative temperature coefficient.

7. A Peltier control circuit as set forth in claim 4 or 6, wherein said resistor having a positive temperature coefficient includes the serial connection of a resistor to a posistor.

8. A Peltier control circuit as set forth in claim 5 or 6, wherein said resistor having a negative temperature coefficient includes the serial connection of a resistor to a thermistor.

9. A Peltier control circuit as set forth in claim 6, wherein said reference voltage corresponds to a cross point value at which said output driving current via said resistor having a positive temperature coefficient intersects said input driving current via said resistor having a negative temperature coefficient.

10. A Peltier control circuit as set forth in claim 1, wherein said comparing section includes a first comparator for comparing a temperature detection voltage from said temperature sensing section with a first reference voltage corresponding to a starting point for driving said output driving current and a second comparator for comparing a temperature detection voltage from said temperature sensing section with a second reference voltage corresponding to a starting point for driving said input driving current.

11. A Peltier control circuit as set forth in claim 10, wherein the difference between said first reference voltage and said second reference voltage is used to compress or expand a region of a temperature dead zone in which said input driving current alternates with said output driving current.

12. A Peltier control circuit as set forth in claim 11, wherein said limiting section limits said output driving current by providing a comparison output from said first comparator to said driving section via a resistor having a positive temperature coefficient.

13. A Peltier control circuit as set forth in claim 11, wherein said limiting section limits said input driving current by providing a comparison output from said second comparator to said driving section via a resistor having a negative temperature coefficient.

14. A Peltier control circuit as set forth in claim 11, wherein said limiting section limits said output driving current by providing a comparison output from said first comparator to said driving section via a resistor having a positive temperature coefficient, and limits said input driving current by providing a comparison output from said second comparator to said driving section via a resistor having a negative temperature coefficient.

15. A Peltier control circuit as set forth in claim 12 or 14, wherein said resistor having a positive temperature coefficient includes the serial connection of a resistor to a posistor.

16. A Peltier control circuit as set forth in claim 13 or 14, wherein said resistor having a negative temperature coefficient includes the serial connection of a resistor to a thermistor.

* * * * *